United States Patent
Lesea et al.

(10) Patent No.: US 6,836,168 B1
(45) Date of Patent: Dec. 28, 2004

(54) LINE DRIVER WITH PROGRAMMABLE SLEW RATES

(75) Inventors: Austin H. Lesea, Los Gatos, CA (US); Atul V. Ghia, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 119 days.

(21) Appl. No.: 10/264,204

(22) Filed: Oct. 2, 2002

(51) Int. Cl.$^7$ ................................................ H03K 5/12
(52) U.S. Cl. ...................................................... 327/170
(58) Field of Search ................................. 327/112, 131, 327/134–136, 170, 172, 261–264, 269, 427, 434, 437, 291–294, 298; 326/83, 85, 87

(56) References Cited

U.S. PATENT DOCUMENTS 5,959,481 A * 9/1999 Donnelly et al. ........... 327/170
6,333,654 B1 * 12/2001 Harris et al. ................ 327/170
6,617,895 B2 * 9/2003 Zumkehr et al. ........... 327/170

* cited by examiner

Primary Examiner—My-Trang Nu Ton
(74) Attorney, Agent, or Firm—Edward S. Mao; Edel M. Young; Lois D. Cartier

(57) ABSTRACT

A line driver with programmable slew rates is disclosed. The line driver can be configured to have a slew rate based on a desired fraction of the clock period of the system clock. Specifically, the clock period of the system clock signal is equal to a clock period reference number multiplied by a base delay. A number of base delays is calculated to be equal to the desired fraction of the clock period multiplied by the clock period reference number. The slew rate of the line driver is adjusted to be equal to the number of base delays.

21 Claims, 6 Drawing Sheets

LINE DRIVER WITH PROGRAMMABLE SLEW RATES

FIELD OF THE INVENTION

The present invention relates to line drivers in digital systems. More specifically, the present invention relates to a line driver with programmable slew rates.

BACKGROUND OF THE INVENTION

As the speed of digital circuits, such as field programmable gate arrays (FPGAs), microprocessors, and memory circuits, has increased, signal quality becomes ever more important. Generally, as the speed of a digital circuit increases the slew rate i.e. the rate a signal transitions from logic low to logic high or from logic high to logic low also increases. However, very fast slew rates can result in a variety of problems, such as overshoot, undershoot, and ringing.

FIG. 1(a) shows an idealized signal 110 having a rising edge 111 and a falling edge 117. Specifically, rising edge 111 occurs at time t1 and falling edge 117 occurs at time t2. In idealized signal 110, rising edge 111 occurs instantaneously and stops at the logic high voltage Vcc. Similarly, falling edge 116 occurs instantaneously and stops at 0 volts (i.e. the logic low voltage).

FIG. 1(b) shows a realistic high slew rate signal 120. High slew rate signal 120 has a rising edge 121 and a falling edge 126. When a driver with an output waveform like high slew rate signal 120 drives one end of a transmission line, such as a printed circuit board trace connecting the driver to other circuits, the signal voltage tends to overshoot logic high voltage Vcc during rising edges and undershoot ground on falling edges. Thus, an overshoot peak 122 occurs at the end of rising edge 121. Then, as high slew rate signal 120 is brought back towards logic high voltage Vcc an undershoot valley 123 occurs as shown in FIG. 1b. These overshoot peaks and undershoot valleys, known as ringing, may occur several times at each transition before high slew rate signal 120 settles at logic high voltage Vcc. The line driver driving high slew rate signal 120 also tends to undershoot the logic low voltage (i.e. 0 volts) during a falling edge. Thus, an undershoot valley 127 occurs at the end of falling edge 126. Then, as high slew rate signal 120 is brought back towards the logic low voltage (i.e. 0 volts) an overshoot peak 128 may occur.

Overshoot peaks and undershoot valleys in signal transitions may cause a variety of problems. For example, a very large overshoot peak or undershoot valley may cause high slew rate signal 120 to reach a voltage beyond the safe operating range of the digital circuit, which may permanently damage the digital circuit. Signal integrity may also be compromised. For example, a device receiving high slew rate signal 120 may interpret undershoot valley 123 as a transition to logic low followed by a transition to logic high.

As is well known in the art, overshoot and undershoot problems can be reduced by proper impedance matching and controlling slew rate. Practical systems with good impedance matching may still present an imperfect match so the overshot and undershoot is further reduced by reducing the slew rate of a line driver. FIG. 1(c) illustrates a slow slew rate signal 130 having a rising edge 131 and a falling edge 136. Rising edge 131 transitions from logic low to logic high at a slower rate than rising edge 121. Similarly, falling edge 136 transitions from logic high to logic low at a slower rate than falling edge 126. As illustrated in FIG. 1(c), even with a slow slew rate an overshoot peak 132 and undershoot valley 133 may follow rising edge 131. Similarly, an undershoot valley 137 and overshoot peak 138 may follow falling edge 136. However, by lowering the slew rate the magnitudes of the overshoot peaks and undershoot valleys are greatly reduced. Thus, likelihood of damage due to excessive overshooting or undershooting is minimized. Furthermore, the likelihood that a circuit receiving slow slew rate signal 130 would misinterpret an overshoot or undershoot as a signal transition is greatly reduced. Additionally, cross talk coupling between adjacent signals is related to the rate of the rise and fall times in an inverse linear fashion. By lengthening the rise time by a factor of two, the cross talk is also reduced by a factor of two.

Several well-known techniques are used to slow the slew rate of a line driver. For example, some line drivers are formed using a cascade of pull-up and pull-down devices that are activated in sequence to provide gradual transitions. However, conventional methods are generally limited to a single slew rate for a given line driver or a very limited number of preselected slew rates. Conventional line drivers are acceptable for devices designed to operate at a specific frequency. However, for devices such as FPGAs which may operate at a wide range of frequencies, a single slew rate may unduly limit the operating range of these devices. Ideally, the slew rate should be configurable and should be based on the clock period of a clock signal driving the device. Hence, there is a need for a method or system to provide line drivers having configurable slew rates.

SUMMARY

Accordingly, line drivers using the principles of the present invention can provide variable slew rates based on the clock period of a clock signal. Specifically, the line driver has a slew rate that is a desired fraction of the clock period. Furthermore, the line driver can include compensation for temperature, voltage and process variations.

In accordance with one embodiment of the present invention, a clock period of the system clock signal is equal to a clock period reference number multiplied by a base delay of a delay line. A slew rate is set as a percentage of the total length of the period. For example, if the time period is 10 ns, choosing 20% as a settable option would result in setting a 2 ns rise time and a 2 ns fall time. A pull-up/pull-down controller adjusts the slew rate of the line driver to be equal to the specified number of base delays.

Specifically, the input signal of the line driver is coupled to a delay line. The delay line generates a plurality of delayed input signals. The delayed input signals are sequential, with each delayed input signal being delayed one base delay from the previous delayed input signal. The pull-up/pull-down controller receives the plurality of delayed input signals, and selectively applies one or more of the delayed input signals to a controlled pull-up circuit and a controlled pull-down circuit. The controlled pull-up circuit pulls the output signal of the driver to logic high at a slew rate which depends on the subset of delayed input signals applied by the pull-up/pull-down controller. Similarly, the controlled pull-down circuit pulls the output signal of the driver to logic low at a slew rate which depends on the subset of delayed input signals applied by the pull-up/pull-down controller.

The present invention will be more fully understood in view of the following description and drawings.

DETAILED DESCRIPTION

As explained above, conventional line drivers do not provide programmable slew rates. The present invention allows a line driver to be configured to have slew rates proportional to a programmable fraction of the clock period of the system clock signal. In most complex integrated circuits, such as FPGAs and microprocessors, the system clock signal includes a delay lock loop to compensate for skew, environmental conditions (e.g. temperature and voltage), and process variations.

Figure 1A:
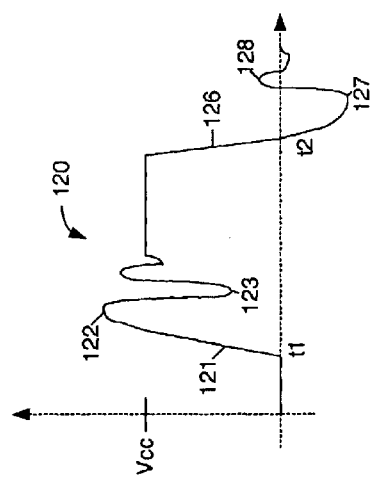
FIG. 1(a) is a diagram of an idealized signal.
Figure 1B:
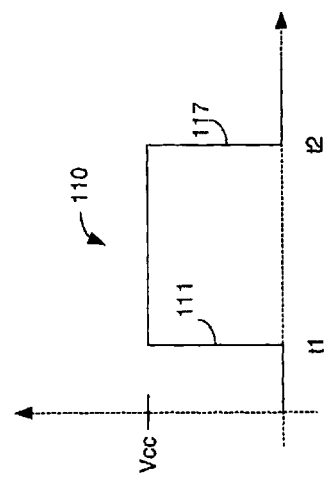
FIG. 1(b) is a diagram of a fast slew rate signal with ringing.
Figure 1C:
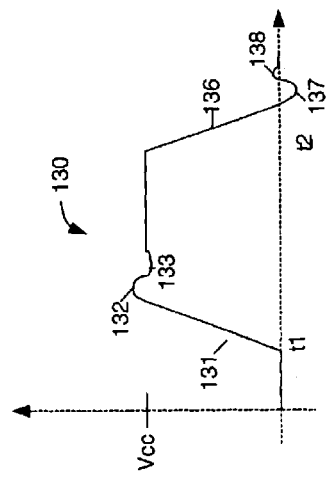
FIG. 1(c) is a diagram of slow slew rate signal.
Figure 2:
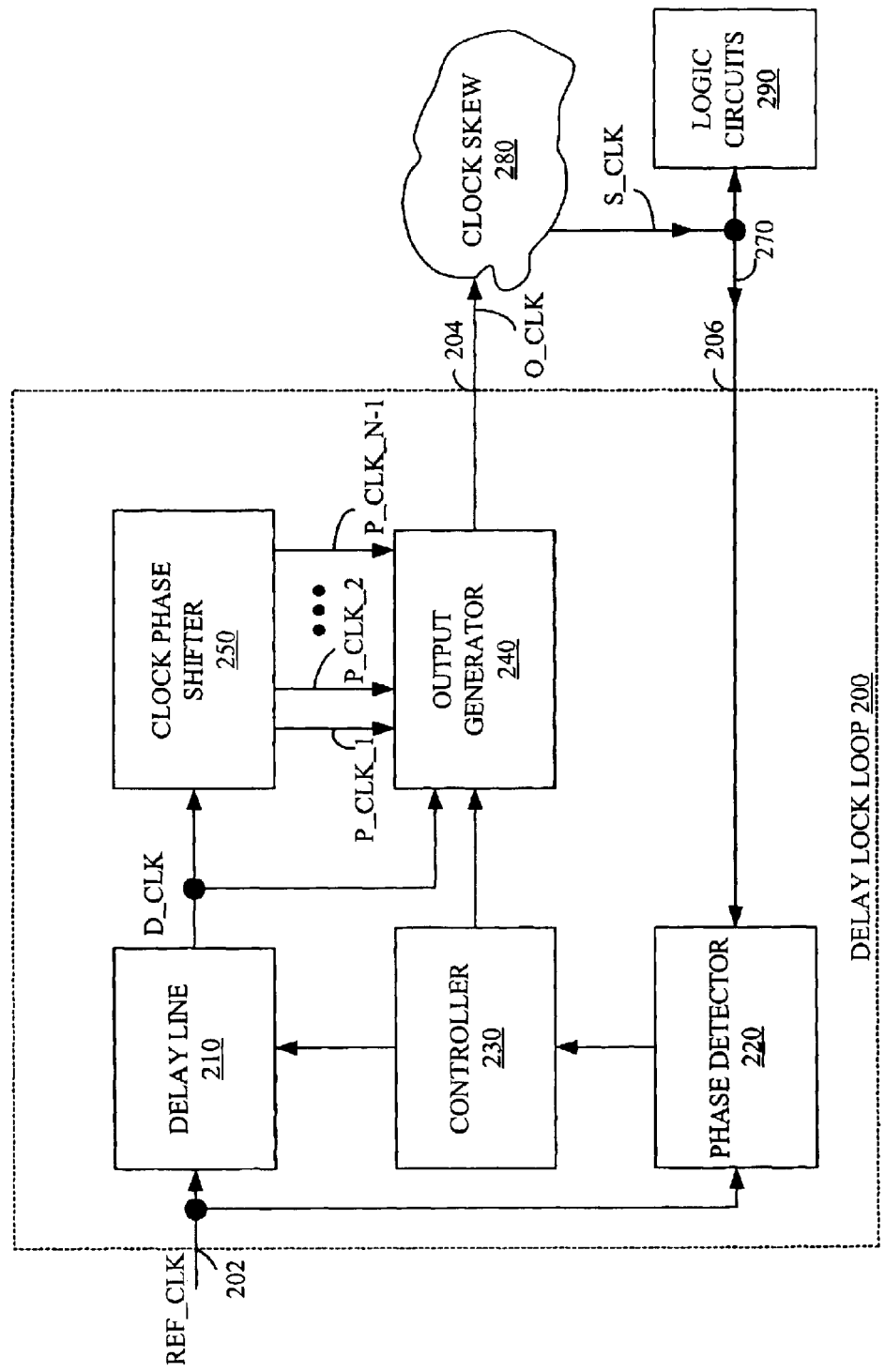
FIG. 2 is a block diagram of a delay lock loop used with the system clock signal.

FIG. 2 is a block diagram of a system using a delay lock loop 200. Delay lock loop 200 comprises a delay line 210, a clock phase shifter 250, a controller 230, an output generator 240, and a phase detector 220. Delay lock loop 200 receives a reference clock signal REF_CLK on a reference input terminal 202 and generates an output clock signal O_CLK on output terminal 204. Output clock signal O_CLK is skewed by clock skew 280 into a skewed clock signal S_CLK, which clocks logic circuits 290. Skewed clock signal S_CLK is also fed back to a feedback terminal 206 of delay lock loop 200 on feedback path 270.

Within delay lock loop 200, reference clock signal REF_CLK is delayed by delay line 210 to generate delayed clock signal D_CLK. Delayed clock signal D_CLK is delayed from clock signal REF_CLK by a propagation delay D in delay line 210. Delayed clock signal D_CLK is provided to an input terminal of a clock phase shifter 250 and to an input terminal of an output generator 240. Because the delay lock loop is not an integral part of the present invention, the functionality of delay lock loop 200 is only briefly described. Detailed description of delay locked loops can be found in U.S. patent application Ser. No. 09/684,529, entitled "Synchronized Multi-Output digital Clock Manager" by Logue et al., which is incorporated herein by reference.

Clock phase shifter 250 generates one or more phase-shifted clock signals P_CLK_1 to P_CLK_N-1, where N is a positive integer. In one embodiment, phase-shifted clock signal P_CLK_1 is phase-shifted by 360/N degrees from delayed clock signal D_CLK. Phase-shifted clock signal P_CLK_2 is phase-shifted by 2*(360/N) degrees. Phase-shifted clock signal P_CLK_N-1 is phase-shifted by (N-1)*(360/N) degrees. Thus, in general a phase-shifted clock signal P_CLK_Z is phase-shifted by Z*(360/N), where Z is an integer between 1 and (N-1), inclusive. Delayed clock signal D_CLK can be considered a phase-shifted clock signal P_CLK_0 since delayed clock signal D_CLK has a 0 degree phase shift from itself. Further, in some embodiments of delay lock loop 200, clock phase shifter 250 generates a phase-shifted signal P_CLK_N that has the same phase and frequency as delayed clock signal D_CLK.

Thus, in an embodiment of clock phase shifter 250 where N is equal to four, phase-shifted clock signal P_CLK_1 is phase-shifted 90 degrees from delayed clock signal D_CLK. It logically follows that phase-shifted clock signal P_CLK_2 is phase-shifted by 180 degrees from delayed clock signal D_CLK and phase-shifted clock signal P_CLK_3 is phase-shifted by 270 degrees from delayed clock signal D_CLK.

Phase shifting is a concept in the frequency domain of a clock signal. The equivalent of phase shifting in the time domain is delaying the clock signal. Specifically, if a first clock signal is phase-shifted from a second clock signal by X degrees, the first clock signal is delayed by X*(P/360), where P is the period of the first and second clock signals. Thus, if phase-shifted clock signal P_CLK_1 is phase-shifted 90 degrees from delayed clock signal D_CLK, phase-shifted clock signal P_CLK_1 is delayed by one-fourth of the period of delayed clock signal D_CLK. To distinguish delays caused by phase shifting from other propagation delays, delays caused by phase shifting are referred to as phase-shifted delays P_D_Z. Since a phase-shifted clock signal P_CLK_Z is phase-shifted by Z*(360/N) degrees, phase-shifted clock signal P_CLK_Z has a phase-shifted delay P_D_Z equal to Z*(P/N), where Z is an integer between 1 and (N-1), inclusive. Clock phase shifter 250 provides the phase-shifted clock signals to various input terminals of output generator 240.

Figure 3:
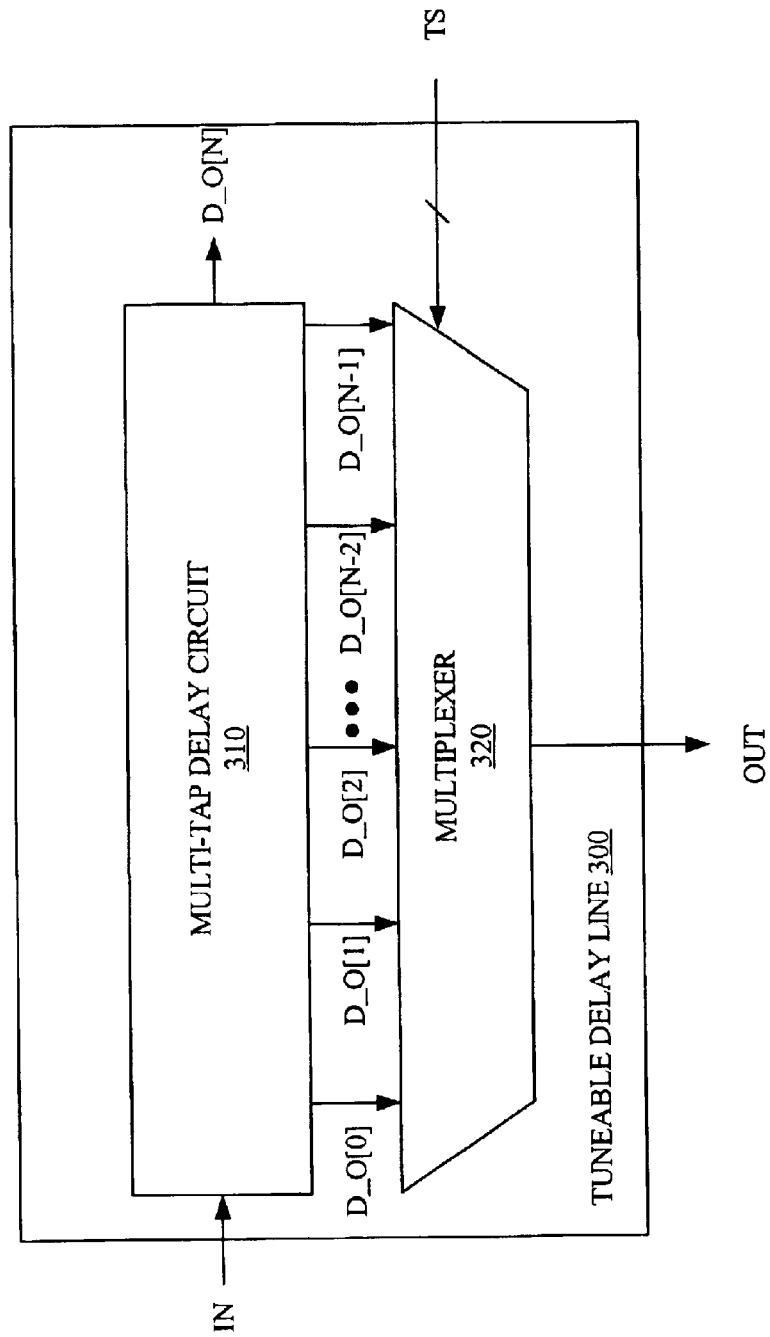
FIG. 3 is block diagram of a delay line.

Most embodiments of clock phase shifter 250 use one or more tuneable delay lines in series to generate the phase shifted clock signals. FIG. 3 shows a typical tuneable delay line 300. Tuneable delay line 300 comprises a multi-tap delay circuit 310 and a multiplexer 320. Multi-tap delay circuit 310 is configured to receive an input signal IN and provide a plurality of delayed output signals D_O[0] to D_O[N] (also called taps). Each output signal is a copy of input signal IN delayed by some multiple of a basic delay of tuneable delay line 300. Specifically, delayed output signal D_O[0] is a copy of input signal IN delayed by zero times the basic delay, (i.e. not delayed). Delayed output signal D_O[1] is a copy of input signal IN, which is delayed by the basic delay. Delay output signal D_O[2] is a copy of input signal IN delayed by two times the basic delay. In general, delayed output signal D_O[X] is a copy of input signal IN delayed by X times the basic delay. Some multi-tap delay circuits 310 may not provide delayed output signal D_O[0].

Multiplexer 320 is configured to receive the delayed output signals. Thus, the input terminals of multiplexer 320 are coupled to the output terminals of multi-tap delay circuit 310. To avoid confusion, terminals are referred to with the same identifier as the signals driven by the terminal. For example, delayed output signal D_O[2] is driven by output terminal D_O[2]. Multiplexer 320 is controlled by tap select signal TS Tap select lines TS select which delayed output signal multiplexer 320 drives output terminal OUT. Specifically, delayed output signal D_O[TS] is selected to drive output terminal OUT.

As explained above, the delay provided by the delay line in clock phase shifter 250 would be configured to be equal to the clock period of the system clock signal. Thus, the total delay value of the delay line in clock phase shifter 250 is equal to the clock period of the system clock signal. Because the delay line in clock phase shifter 250 provides a delay equal to the clock period of the system clock signal, the clock period of the system clock signal can be expressed as tap select signal TS multiplied by the base delay of the delay line.

Returning to FIG. 2, controller 230 receives phase information regarding reference clock signal REF_CLK and skewed clock signal S_CLK from phase detector 220. Specifically, phase detector 220 informs controller 230 whether propagation delay D from delay line 210 should be increased or decreased to achieve synchronization of skewed clock signal S_CLK with reference clock signal REF_CLK.

Synchronization of skewed clock signal S_CLK with reference clock signal REF_CLK is achieved when propagation delay D plus propagation delay SKEW is equal to a multiple of period P. That is, D+SKEW=MULT (P), where MULT P refers to a multiple of P. In delay lock loop 200, controller 230 can also use the delays from the phase-shifted clock signals. Thus delay lock loop 200 can achieve synchronization if propagation delay D plus a phase-shifted delay P_D from a phase-shifted clock signal plus propagation delay SKEW is a multiple of period P. Thus, D+P_D_Z+SKEW=MULT(P), where P_D_Z refers to a phase-shifted delay from phase shifted clock signal P_CLK_Z.

As stated above, the specifics of delay lock loop 200 are not an integral part of the present invention. However, as explained above, the tap select TS of the delay line used in clock phase shifter 250 provides a relative value for the clock period of the system clock signal. For example, if tap select signal TS is equal to 100, then tap number 100 of the delay line in clock phase shifter 250 is currently being used, and the clock period of the system clock signal is equal to approximately 100 multiplied by the base delay of the delay line. If the slew rate of a line driver is to be configured to be 5% of the system clock period, the transition time of a signal should last 5 base delays. In some embodiments of clock phase shifter 250 multiple delay lines are used in series. These delay lines provide a total delay equal to the period of system clock signal. For these embodiments, the sum of the tap selects of all the delay lines provides the number which when multiplied by the base delay provides the period of the system clock signal. For clarity, a clock period reference number CPRN is used to denote the integer which when multiplied by the base delay of the delay line in the clock phase shifter would equal the clock period of the system clock.

Figure 4:
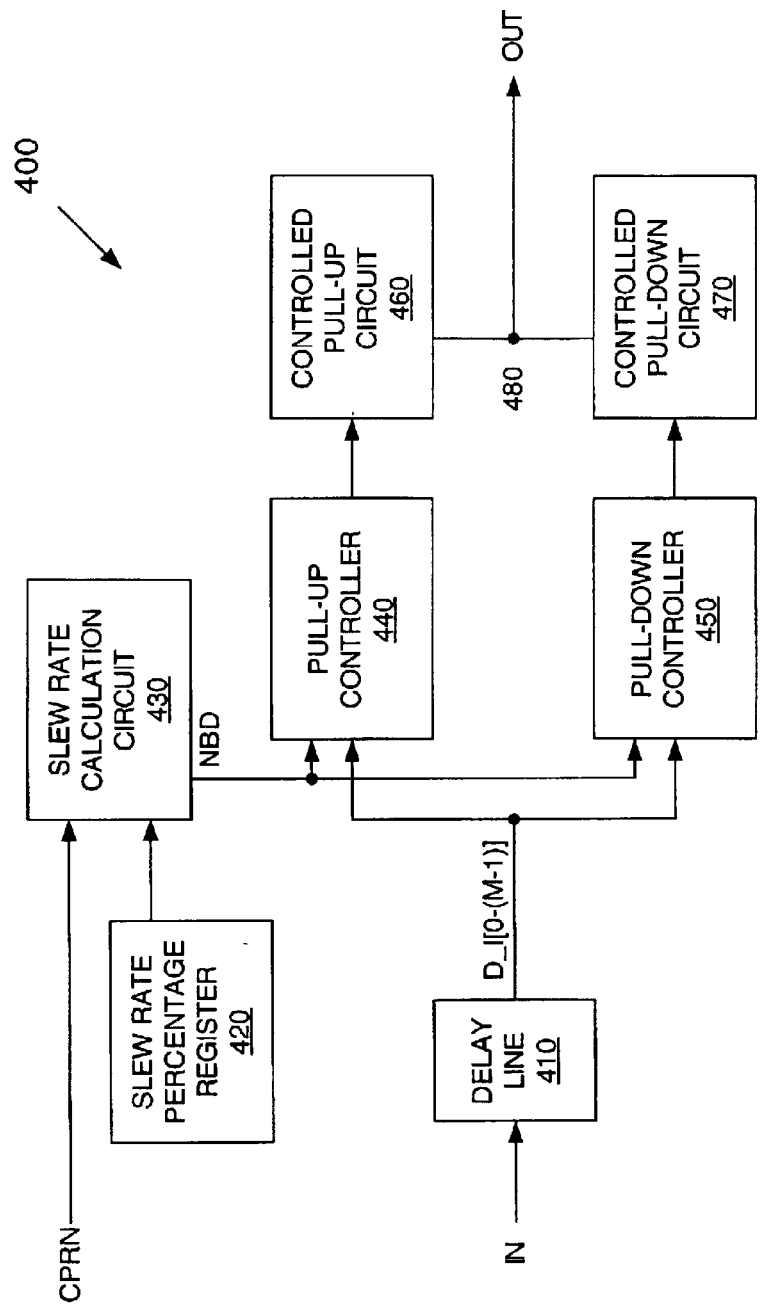
FIG. 4 is a block diagram of a line driver in accordance with one embodiment of the present invention.

FIG. 4 shows an inverting line driver 400 in accordance with one embodiment of the present invention. For clarity, only inverting line drivers are described. However, one skilled in the art can easily adapt the principles of the present invention for use in non-inverting line drivers. Inverting line driver 400 includes a delay line 410 that has the same base delay as the delay line in clock phase shifter 250. Delay line 410 is capable of providing a maximum delay of M (an integer) times the base delay. Line driver 400 also includes a slew rate fraction register 420, a slew rate calculation circuit 430, a pull-up controller 440, a pull-down controller 450, a controlled pull-up circuit 460, and a controlled pull-down circuit 470. Some embodiments of the present invention my use a single pull-up/pull-down controller in place of pull-up controller 440 and pull-down controller 450.

Inverting line driver 400 receives an input signal IN and generates an output signal OUT. Specifically, delay line 310 receives input signal IN. Delay line 410 has M delayed input signals D_I[0-(M-1)], which are applied to pull up controller 440 and pull down controller 450. Each delayed input signal D_I[X] is a copy of input signal IN delayed by X times the base delay of delay line 410. In some embodiments of line driver 400, delay line 410 also provides delayed input signal D_I[M].

Slew rate fraction register, which is user configurable, stores the desired slew rate as a fraction of the clock period of the system clock signal. Slew rate calculation unit computes a number of base delays NBD, which are in the desired fraction of the clock period of the system clock signal. Specifically, slew rate calculation circuit 430 computes number of base delays NBD to be equal the smaller of M (the maximum number of base delays that delay line 410 can provide) or the integer portion of clock period reference number CPRN multiplied by the desired fraction stored in slew rate fraction register 420. For example if clock period reference number CPRN is equal to 128, the desired fraction in slew rate fraction register 420 is 4.5%, and M is 7. Slew rate calculation circuit 430 computes number of base delays NBD to be equal to int(128*0.045) which is equal to 5 (i.e. the integer portion of 5.76). However, if M were equal 4, the number of base delays would be limited to 4 rather than 5. Slew rate calculation unit 430 provides number of base delays NBD to pull up controller 440 and pull-down controller 450.

Output signal OUT is generated at a node 480. Controlled pull-up circuit 460 drives output signal OUT to logic high under control of pull-up controller 440. Pull-up controller 440 controls controlled pull-up circuit 460 so that controlled pull-up circuit 460 causes the transition of output signal OUT from logic low to logic high to take approximately the number of base delays NBD times the base delay of delay line 410. Pull-up controller 440 uses delayed input signals D_I[0-(M-1)] for timing control. Controlled pull-down circuit 470 drives output signal OUT to logic low under control of pull-down controller 450. Pull-down controller 450 controls controlled pull-down circuit 470 so that controlled pull-down circuit 470 causes the transition of output signal OUT from logic high to logic low to take approximately the number of base delays NBD times the base delay of delay line 410. Pull-down controller 450 uses delayed input signals D_I[0-(M-1)] for timing control.

Figure 5:
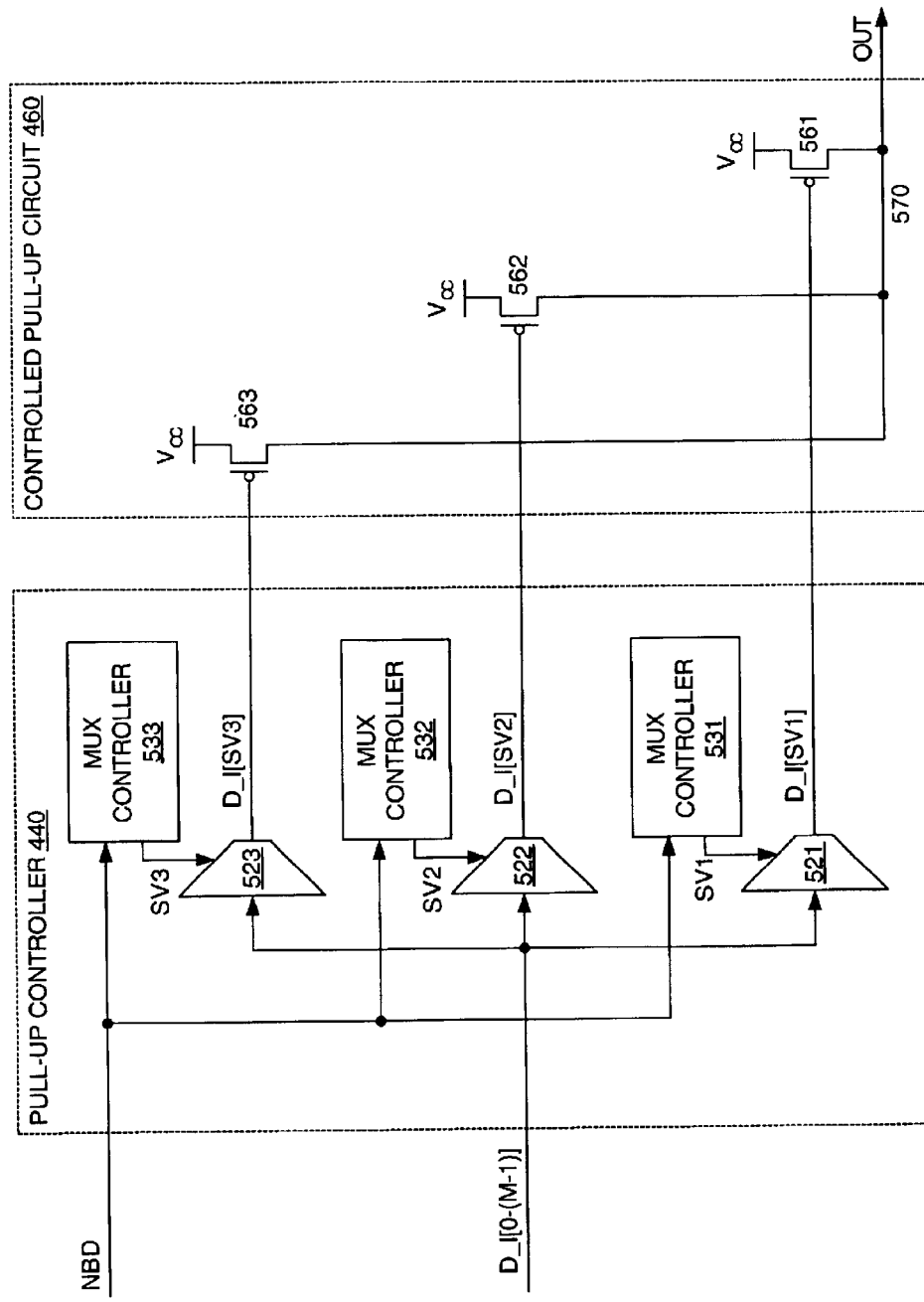
FIG. 5 is a block diagram of a pull-up controller and a controlled pull-up circuit in accordance with one embodiment of the present invention.

FIG. 5 shows an embodiment of pull-up controller 440 and controlled pull-up circuit 460. In the embodiment of FIG. 5, pull-up controller 440 includes multiplexers 521, 522, and 523, and MUX controllers 531, 532, and 533. Controlled pull-up circuit 460 includes pull-up transistors 561, 562, and 563. Delayed input signals D_I[0-(M-1)] are applied to the input terminals of multiplexers 521, 522, and 523. The output terminals of multiplexers 521, 522, and 523 are coupled to the control terminals of pull-up transistors 561, 562, and 563, respectively. MUX controllers 531, 532, and 533 controls which delayed input signal is driven out by multiplexers 521, 522, and 523, respectively. Specifically, MUX controller 531 selects which delayed input signal is driven by multiplexer 521 by driving a select value SV1 to multiplexer 521. Multiplexer 521 drives delayed input signal D_I[SV1] to the control terminal of transistor 561. Similarly, MUX controllers 532 and 533 drives select values SV2, and SV3 to multiplexers 522 and 523, respectively.

Output signal OUT is generated at a node 570. Pull-up transistors 561, 562, and 563 are coupled between the positive power supply and node 570. To cause a logic low to logic high transition of output signal OUT, pull-up transistors 561 562, and 563 are activated into a conducting state.

The timing of the activation of pull-up transistors 561, 562, and 563 controls the slew rate of the transition. For example the highest slew rate is achieved by activating all three transistors simultaneously. Slower slew rates are achieved by delaying the activation of pull-up transistors 562 and 563.

MUX controllers 531, 532, and 533 are configured to spread the activation of the pull-up and pull-down transistors over number of base delays NBD as provided by calculation circuit 430. For example, if number of base delays NBD is equal to 1 pull-up transistors 561, 562, and 563 should be activated simultaneously using delayed input signal D__I[0]. However, if number of base delays NBD is equal to 3, pull up transistor 561 should be activated by delayed input signal D__0[0], pull-up transistor 562 should be activated by delayed input signal D__I[1], and pull-up transistor 563 should be activated by delayed input signal D__I[3].

Tables 1, 2, and 3 illustrates the values computed by MUX controllers 531, 532, and 533, respectively for the embodiment of FIG. 5 with M (the maximum number of base delays provided by delay line 410) equal to 8.

TABLE 1

| NBD | SV1 |
|---|---|
| 1 | 0 |
| 2 | 0 |
| 3 | 0 |
| 4 | 0 |
| 5 | 0 |
| 6 | 0 |
| 7 | 0 |
| 8 | 0 |

TABLE 2

| NBD | SV2 |
|---|---|
| 1 | 0 |
| 2 | 0 |
| 3 | 1 |
| 4 | 1 |
| 5 | 2 |
| 6 | 2 |
| 7 | 3 |
| 8 | 3 |

TABLE 3

| NBD | SV3 |
|---|---|
| 1 | 0 |
| 2 | 1 |
| 3 | 2 |
| 4 | 3 |
| 5 | 4 |
| 6 | 5 |
| 7 | 6 |
| 8 | 7 |

Although, the embodiment of controlled pull-up circuit 460 include only three pull-up transistors, other embodiments of the present invention may include embodiments of controlled pull-up circuit 460 with a different number of pull-up transistors. The embodiment of FIG. 5 of pull-up controller 440 can be adapted to control additional pull-up transistors by including additional MUX controllers and multiplexers. In general for an embodiment of pull-up controller 440 having M possible base delay, N pull-up transistors, and a desired NMD value of Y, select value SVX(Y), where X is an integer between 1 and N inclusive, can be defined as int(X−1)*(Y−1)/N−1).

Figure 6:
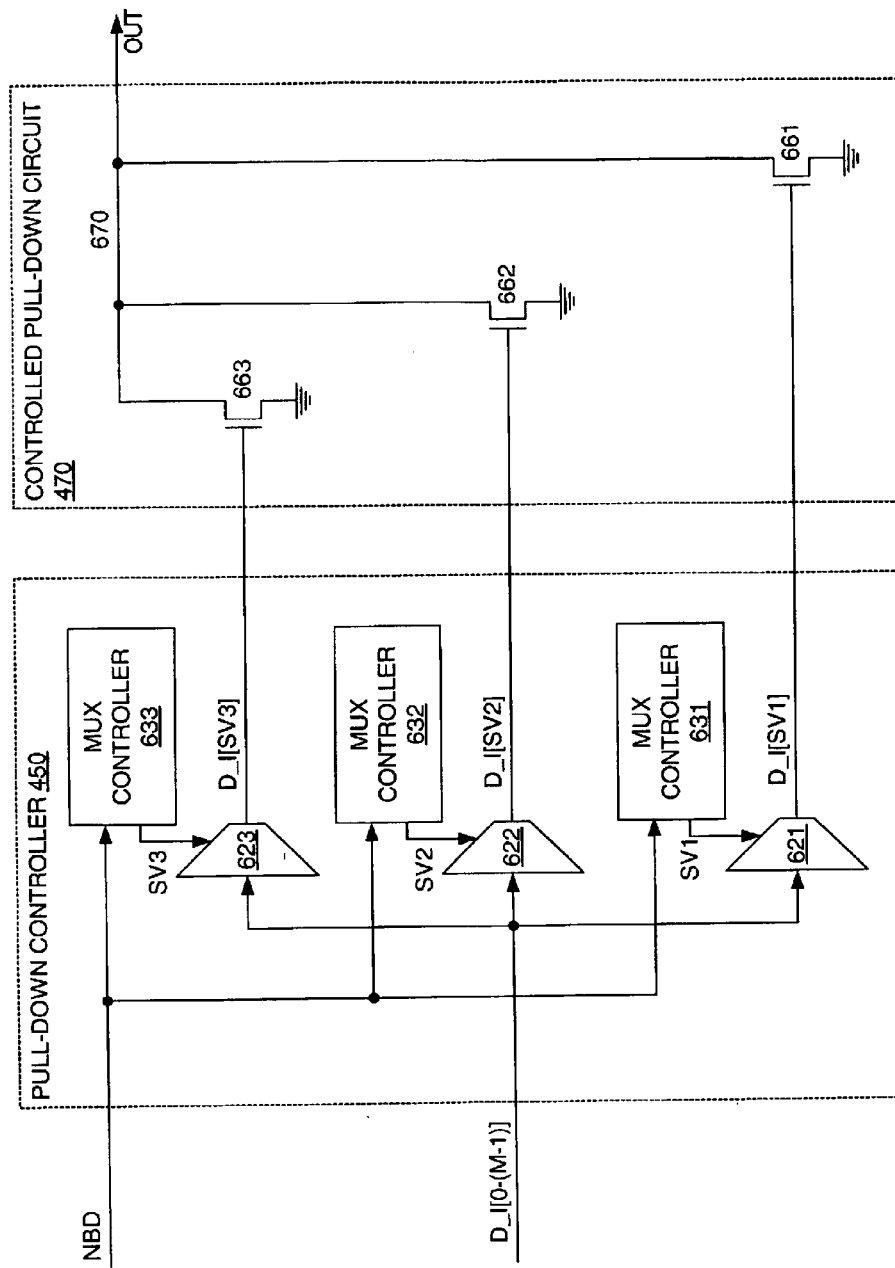
FIG. 6 is a block diagram of a pull-down controller and a controlled pull-down circuit in accordance with one embodiment of the present invention.

FIG. 6 shows an embodiment of pull-down controller 450 and controller pull-down circuit 470. In the embodiment of FIG. 6, pull-down controller 450 includes multiplexers 621, 622, and 623, and MUX controllers 631, 632, and 633. Controlled pull-down circuit 470 includes pull-down transistors 661, 662, and 663. Delayed input signals D__I[0–(M−1)] are applied to the input terminals of multiplexers 621, 622, and 623. The output terminals of multiplexers 621, 622, and 23 are coupled to the control terminals of pull-down transistors 661, 662, and 663, respectively. MUX controllers 631, 632, and 633 controls which delayed input signal is driven out by multiplexers 621, 622, and 623, respectively. Specifically, MUX controller 631 selects which delayed input signal is driven in by multiplexer 621 by driving a select value SV1 to multiplexer 621. Multiplexer 621 drives delayed input signal D__I[SV1] to the control terminal of transistor 661. Similarly, MUX controllers 632 and 633 drives select values SV2, and SV3 to multiplexers 622 and 623, respectively.

Output signal OUT is generated at a node 670 (which is equivalent to node 570 of FIG. 5). Pull-down transistors 661, 662, and 663 are coupled between ground and node 670. To cause a logic high to logic low transition of output signal OUT, pull-down transistors 661, 662, and 663 are activated into a conducting state. The timing of the activation of pull-down transistors 661, 662, and 663 controls the slew rate of the transition. For example the highest slew rate is achieved by activating all three transistors simultaneously. Slower slew rates are achieved by delaying the activation of pull-down transistors 662 and 663.

Because the functionality of pull-down controller 450 is identical to the functionality of pull-up controller 440, the functional description is not repeated. Furthermore, some embodiments of the present invention use a single pull-up/pull-down controller to control both controlled pull-up circuit 460 and controlled pull-down circuit 470.

Other benefits of using the delay lock loop to control slew rate is that delay lock loops are designed to compensate for operating conditions. In addition most delay lock loops are also adjusted to compensate for process variations. Thus, using a measure of the clock period from the delay lock loop has the benefit of automatically being compensated for process variations and operating conditions.

In the various embodiments of this invention, novel structures and methods have been described to allow line drivers to have a programmable slew rate. Specifically, the slew rate can be selected as a fraction of the clock period of the system clock signal. The various embodiments of the structures and methods of this invention that are described above are illustrative only of the principles of this invention and are not intended to limit the scope of the invention to the particular embodiments described. For example, in view of this disclosure, those skilled in the art can define other delay locked loops, clock phase shifters, delay lines, pull-up controllers, pull-down controllers, controlled pull-up circuits, controlled pull down circuits, slew rate calculation circuits, line drivers, MUX controllers, and so forth, and use these alternative features to create a method or system according to the principles of this invention. Thus, the invention is limited only by the following claims.

What is claimed is:

1. A method of controlling a slew rate of a driver output signal in a system having a system clock period equal to a clock period reference number multiplied by a base delay, the method comprising:

selecting a desired fraction of the clock period;

calculating a number of base delays equal to the desired fraction of the clock period; and adjusting the slew rate of the driver output signal to be equal to the number of base delays.

2. The method of claim 1, wherein the driver output signal is derived from a driver input signal.

3. The method of claim 2, further comprising:

generating a plurality of M delayed input signals from the driver input signal;

selectively applying the delayed input signals to control terminals of a first plurality of transistors and a second plurality of transistors.

4. The method of claim 3, wherein:

a first delayed input signal is offset from the driver input signal by a base delay;

a second delayed input signal is offset from the driver input signal by two base delays; and a third delayed input signal is offset from the driver input signal by three base delays.

5. The method of claim 3, wherein the calculating a number of base delays equal to the desired fraction of the clock period; further comprises:

multiplying the desired fraction by the clock period reference number to derive a product;

equating the number of base delays to an integer portion of the product when the integer portion of the product is less than M; and equating the number of base delays to M when the integer potion of the product is greater than or equal to M.

6. The method of claim 3, wherein the first plurality of transistors consists of N sequentially ordered transistors; and the plurality of M delayed input signals are sequentially ordered so that a k+1 delayed input signal is offset from k delayed input signal by 1 base delay.

7. The method of claim 6, wherein an Xth transistor of the first plurality of transistor receives int((X−1)*(the number of base delays−1)/(N−1)) delayed input signal.

8. A line driver having a driver output signal with a controllable slew rate, the line driver comprising:

a delay line coupled to receive a driver input signal and configured to generate a plurality of delayed input signals;

a slew rate calculation circuit configured to generate a number of base delay signal;

a pull-up/pull-down controller coupled to the slew rate calculation circuit and the delay line;

a controlled pull-up circuit coupled to the pull-up/pull-down controller; and a controlled pull-down circuit coupled to the pull-up/pull-down controller.

9. The line driver of claim 8, wherein the pull-up/pull-down controller comprises:

a pull-up controller coupled to the controlled pull-up circuit; and a pull-down controller coupled to the controlled pull-down circuit.

10. The line driver of claim 8, wherein the slew rate calculation circuit computes the number of base delay from a clock period reference number and a desired fraction of the clock period.

11. The line driver of claim 8, wherein a first delayed input signal is offset from the driver input signal by a base delay;

a second delayed input signal is offset from the driver input signal by two base delays; and a third delayed input signal is offset from the driver input signal by three base delays.

12. The line driver of claim 8, wherein the controlled pull-up circuit comprises a plurality of N transistors coupled between a driver output node and a positive supply voltage.

13. The line driver of claim 12, wherein the pull-up/pull-down controller comprises a plurality of multiplexers, wherein each of the multiplexers includes a plurality of input terminals coupled to receive the plurality of delayed input signals and an output terminal coupled to a control terminal of a transistor in the controlled pull-up circuit.

14. The line driver of claim 13, wherein the pull-up/pull-down controller includes a plurality of multiplexer controllers coupled to receive the number of base delays.

15. In a system having a system clock period equal to a clock period reference number multiplied by a base delay, a method for controlling an output signal with a programmable slew rate comprising:

selecting a desired fraction of the clock period;

calculating a number of base delays equal to the desired fraction of the clock period; and adjusting the slew rate of the driver output signal to be equal to the number of base delays.

16. The method of claim 15, wherein the driver output signal is derived from a driver input signal.

17. The method of claim 16, further comprising:

generating a plurality of M delayed input signals from the driver input signal;

selectively applying the delayed input signals to control terminals of a first plurality of transistors and a second plurality of transistors.

18. The method of claim 17, wherein:

a first delayed input signal is offset from the driver input signal by a base delay;

a second delayed input signal is offset from the driver input signal by two base delays; and a third delayed input signal is offset from the driver input signal by three base delays.

19. The method of claim 17, wherein calculating a number of base delays equal to the desired fraction of the clock period; further comprises:

multiplying the desired fraction by the clock period reference number to derive a product;

equating the number of base delays to an integer portion of the product when the integer portion of the product is less than M; and equating the number of base delays to M when the integer potion of the product is greater than or equal to M.

20. The method of claim 17, wherein the first plurality of transistors consists of N sequentially ordered transistors; and the plurality of M delayed input signals are sequentially ordered so that a k+1 delayed input signal is offset from k delayed input signal by 1 base delay.

21. The method of claim 20, wherein an Xth transistor of the first plurality of transistor receives int((X−1)*(the number of base delays−1)/(N−1)) delayed input signal.

* * * * *